(12) United States Patent
Ghosh et al.

(10) Patent No.: US 11,749,900 B2
(45) Date of Patent: Sep. 5, 2023

(54) RADAR STANDING WAVE DAMPENING COMPONENTS AND SYSTEMS

(71) Applicant: 3M Innovative Properties Company, St. Paul, MN (US)

(72) Inventors: Dipankar Ghosh, Oakdale, MN (US); Jaewon Kim, Woodbury, MN (US); Stephen J. Etzkorn, Woodbury, MN (US); Ronald D. Jesme, Plymouth, MN (US); Mohsen Salehi, Woodbury, MN (US); Guanglei Du, Horseheads, NY (US); John A. Wheatley, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 334 days.

(21) Appl. No.: 17/044,054

(22) PCT Filed: Apr. 4, 2019

(86) PCT No.: PCT/IB2019/052758
§ 371 (c)(1),
(2) Date: Sep. 30, 2020

(87) PCT Pub. No.: WO2019/193528
PCT Pub. Date: Oct. 10, 2019

(65) Prior Publication Data
US 2021/0050673 A1    Feb. 18, 2021

Related U.S. Application Data

(60) Provisional application No. 62/654,127, filed on Apr. 6, 2018.

(51) Int. Cl.
*H01Q 1/42* (2006.01)
*H01Q 17/00* (2006.01)
(Continued)

(52) U.S. Cl.
CPC .............. *H01Q 17/004* (2013.01); *G01S 7/03* (2013.01); *H01Q 1/3233* (2013.01); *H01Q 1/38* (2013.01);
(Continued)

(58) Field of Classification Search
CPC ...... H01Q 17/004; H01Q 1/3233; H01Q 1/38; H01Q 1/421; H01Q 1/525; H01Q 19/021; G01S 7/03; G01S 7/027; H05K 1/0237
See application file for complete search history.

(56) References Cited

U.S. PATENT DOCUMENTS 3,780,374 A    12/1973    Shibano
4,767,726 A    8/1988    Marshall
(Continued)

FOREIGN PATENT DOCUMENTS

| CN | 102904044 A | * | 7/2011 | ........... H01Q 1/3233 |
| CN | 102904044 | | 1/2013 | |

(Continued)

OTHER PUBLICATIONS

International Search Report for PCT International Application No. PCT/IB2019/052758, dated Jul. 9, 2019, 5 pages.

*Primary Examiner* — David E Lotter
(74) *Attorney, Agent, or Firm* — Jonathan L. Tolstedt

(57) ABSTRACT

Radar standing wave dampening systems and components are described. In particular, systems and components including an absorber composite including at least one of ceramic filler, magnetic filler, or conductive filler materials are described. Such components can reduce the intensity of standing waves and may also be combined in systems with one or more gradient permittivity tapes or films.

16 Claims, 6 Drawing Sheets

(51) Int. Cl.
  *G01S 7/03* (2006.01)
  *H01Q 1/32* (2006.01)
  *H01Q 1/38* (2006.01)
  *H05K 1/02* (2006.01)
  *G01S 7/02* (2006.01)

(52) U.S. Cl.
  CPC ........... *H01Q 1/421* (2013.01); *H05K 1/0237* (2013.01); *G01S 7/027* (2021.05)

(56) References Cited

U.S. PATENT DOCUMENTS

| | | | | |
|---|---|---|---|---|
| 5,438,333 | A * | 8/1995 | Perkins | H01Q 17/001 |
| | | | | 342/4 |
| 7,834,799 | B1 * | 11/2010 | Wells | H01Q 17/002 |
| | | | | 342/3 |
| 9,704,613 | B2 | 7/2017 | Ghosh | |
| 2003/0020657 | A1 | 1/2003 | Sakamoto et al. | |
| 2005/0001757 | A1 * | 1/2005 | Shinoda | H01Q 1/42 |
| | | | | 342/70 |
| 2009/0101873 | A1 * | 4/2009 | Tan | H05K 9/0083 |
| | | | | 252/500 |
| 2009/0213019 | A1 * | 8/2009 | Schoebel | H01Q 1/3283 |
| | | | | 343/872 |
| 2013/0063296 | A1 * | 3/2013 | Hennig | H01Q 17/004 |
| | | | | 342/1 |
| 2015/0042502 | A1 | 2/2015 | Gonzalez et al. | |
| 2016/0036122 | A1 | 2/2016 | Debray | |
| 2016/0164187 | A1 * | 6/2016 | Ohkoshi | H01Q 17/004 |
| | | | | 342/1 |
| 2017/0055344 | A1 * | 2/2017 | Menge | H05K 1/0298 |
| 2017/0207513 | A1 | 7/2017 | Miyoshi | |
| 2021/0028538 | A1 * | 1/2021 | Jesme | H01Q 1/421 |

FOREIGN PATENT DOCUMENTS

| | | |
|---|---|---|
| JP | 11330847 A | 11/1999 |
| JP | 2018007108 A | 1/2018 |
| WO | 2015094915 A1 | 6/2015 |
| WO | WO 2016-200662 | 12/2016 |

* cited by examiner

RADAR STANDING WAVE DAMPENING COMPONENTS AND SYSTEMS

BACKGROUND

Radar units are used in a growing number of applications, including in automobiles for collision avoidance, situational awareness for autonomous and semi-autonomous driving, and other general sensing applications. Standing waves can be formed between two reflective surfaces at a fixed distance, including between the radar unit or a surface it is attached to and a protective covering, radome, or vehicle fascia.

SUMMARY

In one embodiment, the present description relates to a radar standing wave dampening system. The radar standing wave dampening system includes a mount including a printed circuit board, a radio wave generating unit disposed on the mount, a radio wave sensing unit disposed on the mount, and a non-target interface at a fixed distance from the radio wave generating unit, where the non-target interface as a relative permittivity for the frequency range of the radio waves greater than 1. The printed circuit board is a multilayer stack, and at least one layer includes an absorber composite including at least one of ceramic filler, magnetic filler, or conductive filler materials.

In another embodiment, the present description relates to a radar unit. The radar unit includes a printed circuit board including an insulator layer and at least one patterned conductive layer disposed on at least one major surface of the insulator layer, a radio wave generating unit disposed on the printed circuit board, a radio wave sensing unit disposed on the printed circuit board, and an absorber composite including at least one of ceramic filler, conductive filler, or magnetic filler materials, disposed on at least one major surface of the printed circuit board to form a multilayer stack.

In yet another embodiment, the present description relates to an unpatterned circuit board for a radar unit. The unpatterned circuit board for a radar unit includes an insulator layer, at least one conductive layer disposed on a major surface of the insulator layer, and at least one absorber composite disposed on either a major surface of the insulator layer upon which the conductive layer is not or a major surface of the at least one conductive layer to form a multilayer stack. The absorber composite includes at least one of ceramic filler, conductive filler, or magnetic filler materials.

In another embodiment, the present description relates to a method of making an unpatterned circuit board for a radar unit. The method includes providing an insulator layer having at least one conductive layer disposed thereon, and applying an absorber composite including at least one of ceramic filler, conductive filler, or magnetic filler materials to form a multilayer stack.

DETAILED DESCRIPTION

Radio wave generating and receiving units, such as radar (radio detection and ranging) units, may be useful in a diverse and growing application space. For example, as automobiles incorporate more and more sensors in order to enhance driver safety, sense and warn about vehicle surroundings and ambient conditions, and to enable partial or full autonomous driving functions, one or more radar units may be incorporated. For automotive radar applications, microwave generation and receiving units may be used, and so for purposes of this application "radar" and "radio waves" shall include microwave range frequencies as well. For power consumption, safety, and regulatory reasons, these radar units may be relatively low power when compared to those used for, as an example, air traffic monitoring applications. Accordingly, the signal to noise ratios of these lower power units may be more sensitive to interference or attenuation.

In order to protect these radar units from dirt buildup or weather elements such as snow and rain, or, in the case of rotating or moving components, to protect people from injury or accidental damage, the unit is typically protected with a cover. In some cases, this protective cover is referred to as a radome. Alternatively or additionally, these units are sometimes embedded within the body of the vehicle. In some embodiments, these units are placed behind or within the bumper fascia or another vehicle fascia, which serves as the protective cover. Depending on the direction of interest, these radar units can be placed at any location on the vehicle. Typically, they are arranged so that the least amount of material is disposed between the radar unit and its potential—or intended—targets for detection.

However, because a protective cover is typically necessary or desirable to use in conjunction with these radar units, the radio waves generated by a radio wave generating unit and received by a radio wave receiving unit must pass through a interface including a sudden increase in electrical permittivity. Relative permittivity for a given frequency, which, as used herein is the ratio of a material's permittivity to the permittivity of a vacuum, measures the resistance of a material to forming an electric field within itself. Sharp changes in this value—as would be encountered by a radio wave travelling in air at an interface with a non-air material, such as a plastic vehicle fascia, will cause at least some of the radio wave to be reflected at this boundary. The transmitted signal is reflected and detected, giving a false signal. Further, this reflection, combined with potential reflection off of the radar unit or its mount, can lead to the formation of standing waves which can further degrade the signal to noise ratio of the receiving unit by falsely appearing to be a signal.

Figure 1:
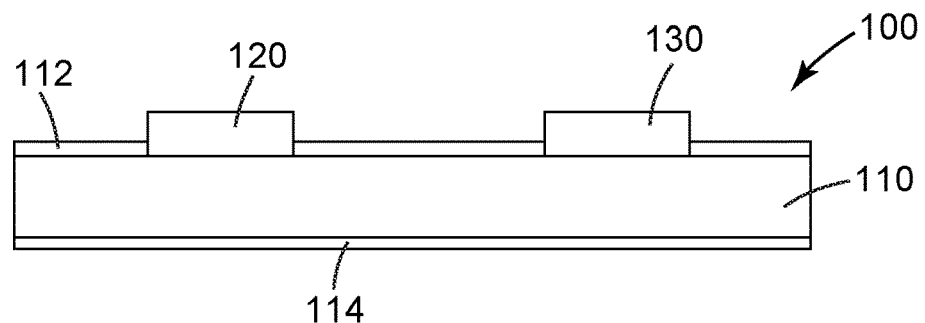
FIG. 1 is a side elevation cross section of a radar unit.

FIG. 1 is a side elevation cross section of a radar unit. Radar unit 100 includes mount with printed circuit board including insulator layer 110, conductive layer 112, and absorber composite layer 114, Radar unit 100 also includes radio wave generating unit 120 and radio wave sensing unit 130.

Radar unit 100 includes both a radio wave generating unit and a radio wave receiving unit. These are typically fixed on a mount or other surface. In some embodiments, the mount is or includes a printed circuit board. Disposing these units on a printed circuit board can be beneficial from a compactness perspective, allowing for simplification of the electronics that power and control into the units. For ease of illustration, other components such as power sources, grounds, and components otherwise required for the operation of the radar unit are not shown. Any suitable radio wave generating and receiving unit may be used. In some embodiments, the radio wave generating unit and the radio wave receiving unit may be part of the same integrated circuit or chip. In some embodiments, the radio wave generating unit and the radio wave receiving unit may be on separate chips, but the same circuit board. In some embodiments, the radio wave generating unit and the radio wave receiving unit may be on separate printed circuit boards, but attached to the same mount or mounting mechanism.

The printed circuit board in FIG. 1 may be any suitable or conventional printed circuit board, formed through any suitable method or technique. In FIG. 1, the printed circuit board includes insulator layer 110 and conductive layer 112. The conductive layer is disposed on at least one major surface of the insulator layer. In some embodiments, the conductive layer may be disposed on both major surfaces of the insulator layer, optionally connected by vias through the insulator layer, such as in FIG. 2. Any suitable material may be used for the conductive layer and for the insulator layer. In some embodiments, the conductive layer is copper or silver, and the insulator is cured epoxy. In some embodiments, the printed circuit board may also include a solder mask layer. The conductive layer may be appropriately patterned to form traces and leads used for the operation of the radar unit, though any suitable process, such as photolithography and etching. For the ease of illustration in FIG. 1, radio wave generating unit 120 and radio wave receiving unit 130 are shown as disposed on insulator layer, but any suitable configuration or attachment—for example, through pins which may extend partially into the insulator layer.

Absorber composite layer 114 is disposed on at least one major surface of the printed circuit board to form a multilayer stack. The absorber composite layer may be a continuous or a discontinuous layer. Depending on the application, absorbing composite layer may be coated over or under a conductive layer or a patterned conductive layer. Any suitable coating process may be used, such as dip coating, spin coating, spray or conformal coating, or even printing. In some embodiments, absorbing composite layer may be coated on the insulator layer where the conductive layer has been etched away to form a patterned conductive layer (in other words, the absorbing composite layer and the patterned conductive layer may be colayers). In some embodiments, particularly embodiments where the absorber composite is disposed within a film layer, such a film may be laminated to one or more of the major surfaces of the printed circuit board.

The absorber composite may include at least one of ceramic filler materials, conductive filler materials, or magnetic filler materials. The conductive filler materials may include, for example, carbon black, carbon bubbles, carbon foam, graphene, carbon fibers, graphite, carbon nanotubes, metal particles, metal nanoparticles, metal alloy particles, metal nanowires, polyacrylonitrile fibers, or conductive coated particles. The ceramic material fillers may include, for example, cupric oxide or titanium monoxide. The magnetic filler materials may include, for example, Sendust, carbonyl iron, permalloy, ferrites (for example, one or more of Mn—Zn ferrite, Mn—Mg—Zn ferrite, Mn—Cu—Zn ferrite, Ba-ferrite or Sr-ferrite), or garnets (for example, YIG: yttrium iron garnet) or GdIG: gadolinium iron garnet). In some embodiments, the absorber composite includes ceramic filler materials and the ceramic filler materials include at least one of cupric oxide or titanium(II) oxide (titanium monoxide). In some embodiments, the absorber composite includes ceramic filler materials and the ceramic filler materials more generally include at least one of metal oxide particles, metal nitride particles, metal carbide particles, metal sulfide particles, metal silicide particles, metal boride particles, particles of multiferroic compounds, mixed ceramic particles, or chalcogenide glass particles. In some embodiments, the absorber composite includes both cupric oxide and carbon black. The absorber composite may be disposed within a polymeric matrix. Any suitable polymer may as a polymeric matrix and the polymer may be selected for its ability to be processed or manufactured, including its rheological properties, such as its glass transition temperature. In some embodiments, the polymeric matrix may be or include a lossy polymeric matrix, having a dielectric loss tangent of from 0.005 to 0.50. In some embodiments, a lossy polymeric matrix includes a fluorocarbon-based polymeric matrix including a polyvinylidene fluoride polymer or copolymer. In some embodiments, the fluorocarbon-based polymeric matrix including a polyvinylidene fluoride polymer or copolymer includes a terpolymer of tetrafluoroethylene, hexafluoropropylene, and vinylidene fluoride. Lossy polymeric matrixes and related absorbing composite constructions are described in U.S. Pat. No. 9,704,613 (Ghosh et al.), which is hereby incorporated by reference in its entirety.

Figure 2:
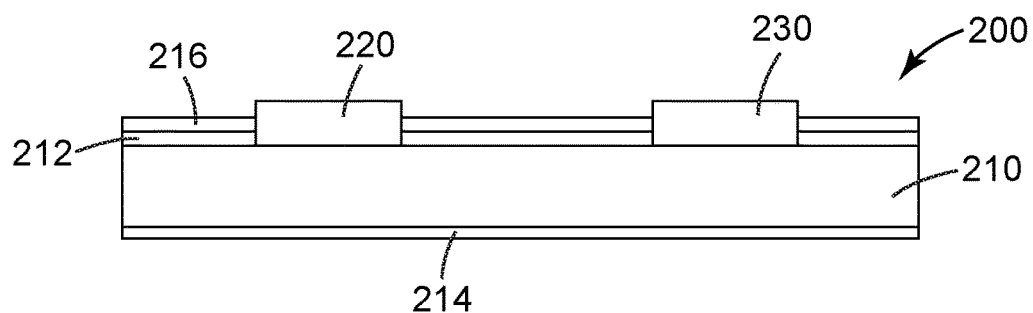
FIG. 2 is a side elevation cross section of another radar unit.

FIG. 2 is a side elevation cross section of another radar unit. Radar unit 200 includes mount with printed circuit board including insulator layer 210, first conductive layer 212, second conductive layer 214, and absorber composite layer 216. Radar unit 200 also includes radio wave generating unit 220 and radio wave sensing unit 230. FIG. 2 illustrates a slightly different embodiment from radar unit 100 of FIG. 1. In FIG. 2, first conductive layer 212 and second conductive layer 214 are disposed on opposite major surfaces of the printed circuit board. Further, absorber composite layer 216 is disposed on the same side as first conductive layer 212. In particular, absorber composite layer 216 is overlaid on first conductive layer 212.

Figure 3:
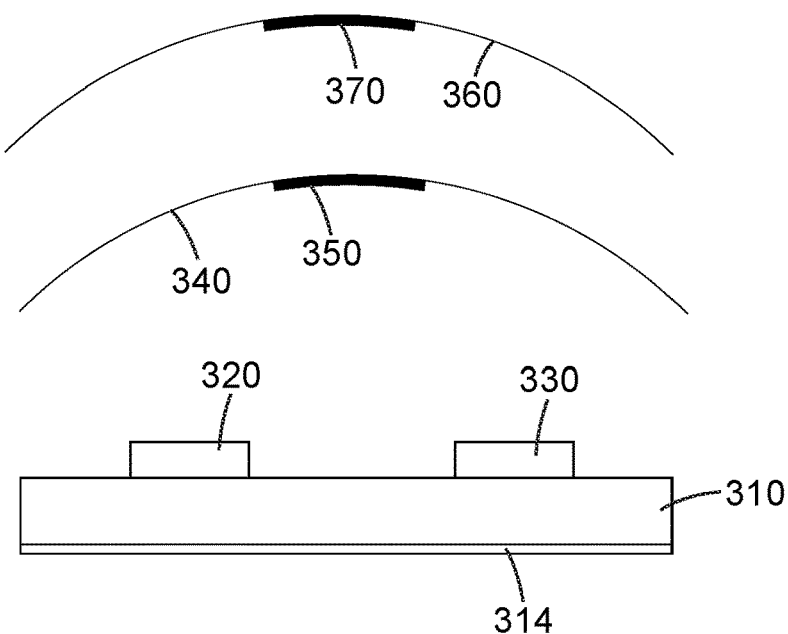
FIG. 3 is a side elevation schematic of a radar standing wave dampening system.

FIG. 3 is a side elevation schematic of a radar standing wave dampening system. Radar standing wave dampening system 300 includes mount with printed circuit board including insulator layer 310 and absorbing layer 314, and radio wave generating unit 320 and radio wave sensing unit 330 disposed thereon. Radar standing wave dampening system 300 also includes first non-target interface 340 with attached first gradient permittivity tape 350 and second non-target interface 360 with attached second gradient permittivity tape 370. The radar unit include the radio wave generating unit and the radio wave receiving unit, the insulator and the absorber composite corresponds to the radar units 100 and 200 in FIGS. 1 and 2, however, in FIG. 3, the patterned conductor layer is not illustrated. In some embodiments, the traces may not be exposed.

FIG. 3 also includes first non-target interface 340 and second non-target interface 360. The non-target interfaces are so described because they are not intended to be detected by the radar unit. In some embodiments, these non-target interfaces may be located a fixed distance from the radar unit, making it possible to form one end of a boundary for the formation of a standing wave. These non-target interfaces may include or be any non-air material non-intended to be detected by the radar unit. For example, a protective cover such as a radome or an external or body surface of a vehicle, such as a vehicle fascia may be considered a non-target interface. In some embodiments, there may only be one non-target interface between the radar unit and the external environment containing detection targets. In some embodiments, there may be more than one: for example, two as shown in FIG. 3 or, in some embodiments, even more than two. As described herein, the inclusion of the absorber composite on the radar unit will dampen and reduce the intensity of standing waves that may form between the radar unit (specifically, any radio-reflective interface including any sharp change in relative permittivity) and one or more non-target interfaces. Additionally, one or more gradient permittivity films or tapes may be provided on either major surface of a non-target interface. Suitable and exemplary gradient permittivity films and tapes are described in conjunction with FIGS. 4, 5, 6, and 7. Additionally or alternatively, gradient permittivity tapes may be or include three-dimensional arrays of cones or pyramids, replicated or formed from any suitable material. In some embodiments, each non-target interface may include a gradient permittivity film or tape. In some embodiments, a non-target interface may include more than one gradient permittivity film or tape.

Figure 4:
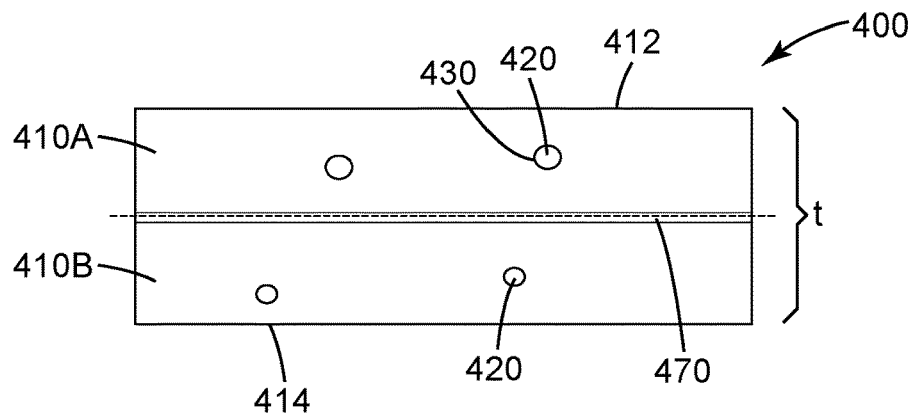
FIG. 4 is a side elevation cross section of a gradient permittivity film.

FIG. 4 is a side elevation cross section of a gradient permittivity film. Gradient permittivity film 400 includes first half 410A closest to first major surface 412 and second half 410B closest to second major surface 414 and laminated together by adhesive 470, continuous matrix of first component 410. with second component 420 disposed within the continuous matrix and optionally disposed within third component 430. The first continuous matrix of the first component has a first relative permittivity $\varepsilon_{r1}$. The second component has a second relative permittivity $\varepsilon_{r2}$, where $\varepsilon_{r1}$ is greater than $\varepsilon_{r2}$ for at least one wavelength within a wavelength range. In some embodiments, the wavelength range may be any wavelength range within the radio and microwave wavelength range. In some embodiments, the wavelength range may be between 20 GHz and 300 GHz. In some embodiments, the wavelength range may be between 20 GHz and 100 GHz. In some embodiments, the wavelength range may be between 20 GHz and 81 GHz. In some embodiments, the wavelength range may be between 20 GHz and 30 GHz.

In some embodiments, the second component is air or another inert gas. In some embodiments, the second component is a partial vacuum. Given the low relative permittivity of air, gasses, or partial vacuums, the inclusion of the second component within the gradient permittivity film lowers the effective permittivity of that portion of the film. In some embodiments, second component 420 is freely disposed within the continuous matrix of the first component—such as in the form of air or gas bubbles. In some embodiments, nanoparticles such as silsesquioxane nanoparticles can be used to add porosity to a polymer layer, such as an epoxy or silicone layer. However, in some embodiments, second component 420 is disposed within a different material. For example, in some embodiments, second component 420 is disposed within glass. Glass microbubbles are generally formed by simultaneous fusion of glass-forming components and the expansion of the fused mass. See generally U.S. Pat. No. 4,767,726 (Marshall). Similarly, polymeric or plastic microbubbles (such as polyethylene, polypropylene, poly(methyl methacrylate) and filled with an inert gas or air may be used. In some embodiments, cenospheres—lightweight spheres typically formed from silica or alumina and filled with air or other inert gas and produced as a byproduct of coal combustion—may be used. In some embodiments, ceramic particles may be used. These ceramic particles may be porous and include air or another inert gas. In some embodiments, any of the particles described herein may be coated with or may include an absorber composite. The absorber composite may include at least one of ceramic filler materials, conductive filler materials, or magnetic filler materials. The conductive filler materials may include, for example, carbon black, carbon bubbles, carbon foam, graphene, carbon fibers, graphite, carbon nanotubes, metal particles, metal nanoparticles, metal alloy particles, metal nanowires, polyacrylonitrile fibers, or conductive coated particles. The ceramic material fillers may include, for example, cupric oxide or titanium monoxide. The magnetic filler materials may include, for example, Sendust, carbonyl iron, permalloy, ferrites, or garnets. The third component has a third relative permittivity $\varepsilon_{r3}$, and $\varepsilon_{r2} \le \varepsilon_{r3}$ for the wavelength within the wavelength range. Any combination or blend of particles and free voids or bubbles can be used within the continuous matrix of the first component.

The distribution of the second component or its volume fraction within the continuous matrix may vary along one or more non-thickness directions of the film. In some embodiments, the variation may be monotonic. In some embodiments, due to the requisite size and distribution of second component within the continuous matrix of the first component, gradient permittivity films as described herein may have high visible haze or low visible light transmission. In some embodiments, visible haze may be greater than 50%. In some embodiments, visible light transmission may be less than 50%.

Any suitable adhesive may be used as adhesive 470. For example, pressure sensitive adhesives, UV-curable adhesives, silicone-based adhesives, urethane-based adhesives or any other suitable adhesive or combination of adhesives may be used to bond the halves of gradient permittivity film 400 together.

Figure 5:
FIG. 5 is a side elevation cross section of a nonwoven component for a gradient permittivity film.

FIG. 5 is a side elevation cross section of a nonwoven component 500 for a gradient permittivity film. Nonwoven component 300 has intrinsic porosity and contains at least some inert gas (e.g., air) volume fraction provided within the continuous matrix of the nonwoven component. A gradient permittivity film may use a nonwoven component as part of a multilayer stack, wherein the film varies in effective permittivity by controlling or selecting the porosity of the various layers of the nonwoven component. In some embodiments, the porosity of a single nonwoven layer can be controlled along the thickness direction such that a gradient in permittivity is present. Suitable nonwoven components may include spunbond nonwovens, flashspun nonwovens, melt-blown nonwovens, staple nowovens, and may include glass or plastic fibers. In some embodiments, the glass or plastic fibers can themselves contain an inert gas or air component, which may help further tune or control the permittivity gradient along the thickness direction or possibly also in one or more non-thickness directions. Nonwoven components may be used in combination with any other layer described herein, including with one or more layers of a resin matrix with voids or bubbles (plastic or glass or free) disposed therein. Alternatively, and especially in the case of glass or polymer fibers including voids or microbubbles, such fibers can be woven or arranged to form a gradient permittivity film.

Figure 6:
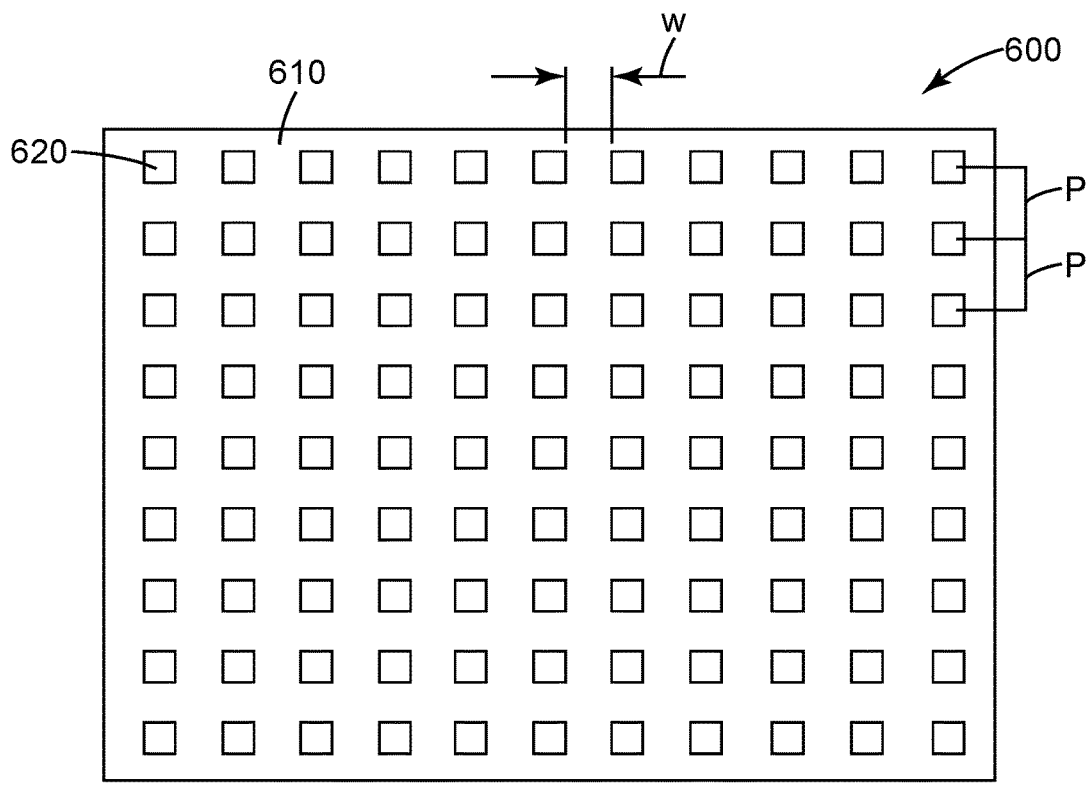
FIG. 6 is a top plan view of a perforated layer.

FIG. 6 is a top plan view of a perforated layer. Perforated layer 600 includes material 610 and perforations 620. Material 610 may be any suitable material and may be formed through any suitable means. In some embodiments, material 610 may be formed from a polymeric resin, including polyethylene terephthalate, polycarbonate, poly(methyl methacrylate), polystyrene, polyurethane, or any other polymer or copolymer and blends thereof. In some embodiments, material 610 can include an absorber composite. The absorber composite may include at least one of ceramic filler materials, conductive filler materials, or magnetic filler materials. The conductive filler materials may include, for example, carbon black, carbon bubbles, carbon foam, graphene, carbon fibers, graphite, carbon nanotubes, metal particles, metal nanoparticles, metal alloy particles, metal nanowires, polyacrylonitrile fibers, or conductive coated particles. The ceramic material fillers may include, for example, cupric oxide or titanium monoxide. The magnetic filler materials may include, for example, Sendust, carbonyl iron, permalloy, ferrites, or garnets. Materials may be selected for their ease of processing, environmental stability, or any other property or combination of properties relating to the material's use in the desired application. For example, in some embodiments, perforated layer 600 may be formed from material 610 suitable to manufacture through injection molding. In some embodiments, perforated layer 600 may be formed from material 610 suitable to manufacture through a microreplication process, such as a continuous cast and cure process. In some embodiments, perforated layer 600 may be formed from material 610 manufactured as a cast film. In some embodiments, perforated layer 600 may be formed from material 610 deposited through an additive three-dimensional printing process. In some embodiments, perforated layer 600 may be formed through a selective curing of a photoresist, such as through a two-photon process. In some embodiments, perforated layer 600 may be formed from material 610 formed through ablation, etching, photolithography, or a similar process to remove material and form the desired shape. In some embodiments, material 610 may include air or other inert gas bubbles or voids, or glass or plastic microbubbles, cenospheres, or porous ceramic particles to lower the effective permittivity of the material. In some embodiments, perforated layer is coated with an inorganic material. In some embodiments, this material is different from any material in the perforated layer. For example, the perforated layer may be coated with one or more of alumina or titania.

Perforated layer may be any suitable thickness. The selection of the thickness may take into account physical robustness and environmental stability (such as resistant to heat-cool cycle warping). Additionally, the suitable thickness may also be bounded as being greater than a minimum thickness so that a radio wave or other electromagnetic wave of interest experiences and interacts with the intermediate change in permittivity. If the thickness is too thin, an incident electromagnetic wave will not interact with the gradient permittivity film. Or, in the case of multilayer gradient permittivity films including a plurality of perforated layers, an electromagnetic wave will interact with the multilayer gradient permittivity film as if it were a single layer of a blended effective permittivity—instead of, as desired, as a film of stepped permittivity from each individual layer. If a film is too thick, it may not be effectively attached or may not remain attached to a surface, and may be less flexible or conformable than desired.

In FIG. 6, perforated layer 600 is characterized by a plurality of perforations 620. Perforations may be any shape or size and may be arranged regularly or irregularly. In some embodiments, each of perforations 620 is the same size and shape. In some embodiments, one or more of the size and shape of perforations 620 vary over perforated layer 600. In some embodiments, one or more of the size and shape of perforations may vary monotonically or smoothly over at least one non-thickness direction. In some embodiments, one or more of the size and shape of the perforations may vary nonperiodically or pseudorandomly.

For regularly arranged perforations, as those shown in FIG. 6, these can be characterized by a width w between perforations corresponding to an average border thickness and a pitch P which is the space between the areal center of one perforation to its next neighbors. In some embodiments, both pitch and width can be averaged over the layer. In some embodiments, to avoid characterizing perforations near the edge which may require thicker borders for stability or robustness, the characterization of the width and pitch may be done for a limited portion near the center of the layer, such as a 1 mm×1 mm square or a 5 mm×5 mm square, ignoring any perforations only partially within that area.

Even for perforations that may not be regularly arranged or may vary over one or more non-thickness directions of the perforated layer, an average border thickness (width) and pitch can be computed and characterized for the layer.

The specific perforation arrangement can lead to the calculation of the air or gas volume fraction for the perforated layer. In some embodiments, the air volume fraction of the perforated layer may be as low as 0 or 0.01 or 0.1 or as high as 0.25, 0.5, 0.75, 0.8 or higher.

In some embodiments, the perforations may be canted or aligned with respect to the thickness direction of the perforated layer. For example, a perforation axis along the center of each perforation may not deviate by more than 30 degrees from a direction along the thickness. As with all other perforation characteristics described herein, such canting can be designed to vary smoothly, periodically or nonperiodically along one or more non-thickness directions.

For ease and practicality of certain manufacturing techniques, in some embodiments, perforations 620 may not fully extend through the thickness of perforated layer 600. Instead, perforated layer 600 may have "land," or a continuous layer of material along at least one side of the perforated layer.

Figure 7:
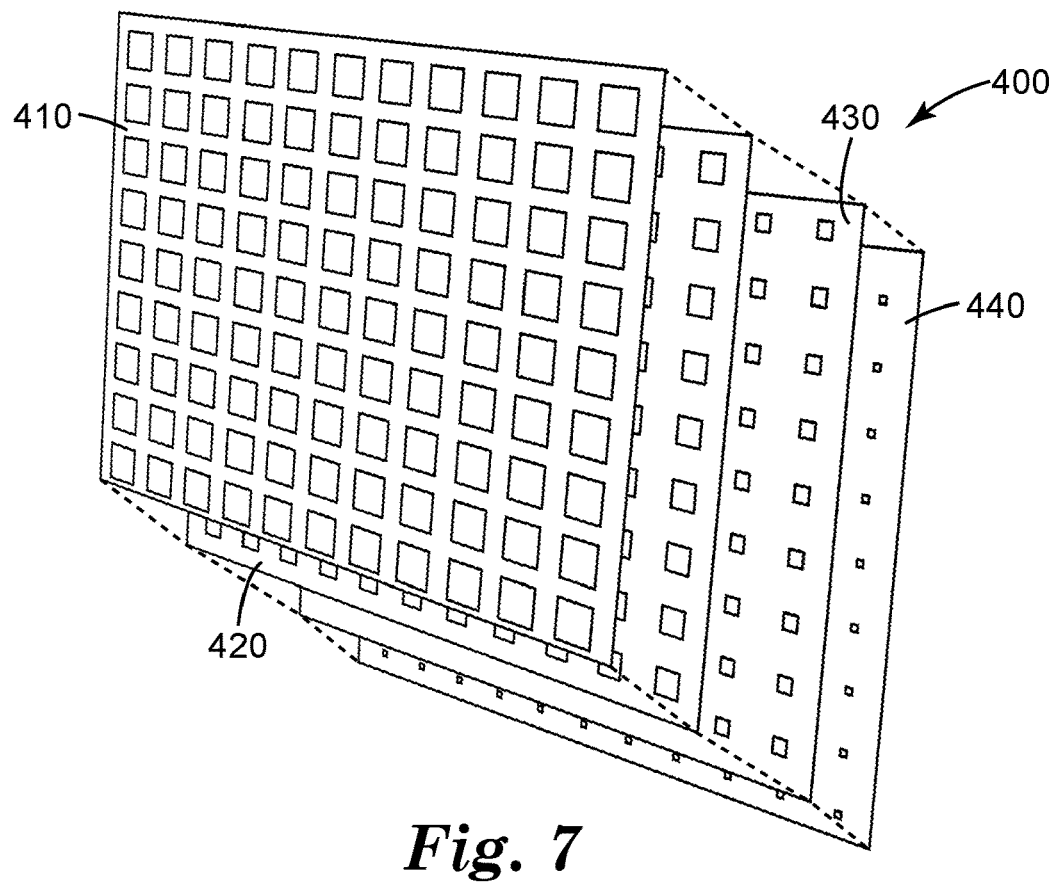
FIG. 7 is an exploded top perspective view of a gradient permittivity film.

FIG. 7 is an exploded top perspective view of a gradient permittivity film. Gradient permittivity film 700 includes first layer 710, second layer 720, third layer 730, and fourth layer 740. Each of the layers is attached or laminated to adjacent layers, either adhesively or through any other suitable method. The layers of gradient permittivity film 700 vary from having a large air volume fraction in first layer 710 to having a smaller air volume fraction in fourth layer 740. The air volume fractions of adjacent layers may differ in some embodiments by at least 0.05. Given the low relative permittivity of air, gasses, or partial vacuums, the inclusion of air or any other gas or partial vacuum within each perforated layer lowers the effective permittivity of that perforated layer. The depiction of four layers in FIG. 4 is meant to be exemplary and any number of suitable layers—more or less—may be stacked in order to provide the desired stepped permittivity.

EXAMPLES

The examples are generally composed of absorbing material layer affixed onto a printed circuit board (PCB) of a radar module. The absorber composite used for these examples are combinations of dielectric lossy ceramic CuO+conductive carbon black (CB) in silicone polymer matrix.

Radar Signal Plot Test

The test set up included (3) essential pieces: (A) a radar testing unit, (B) the sample, positioned directly onto the printed circuit board of the radar testing unit, and (C) a detection target located 3.5 meters away from the radar test unit.

The radar testing unit for these tests was a commercially available INRAS RadarBook with MIMO 77 GHz front-end. The unit provides a measure, Rx signal [dBV], which is a measure of the relative measurement of the detected radar signal reflected by the sample and detection target combined. The output from the testing unit provides a signature of measured signal versus distance from the test head. This is reported simply as "radar signal plot" in measurement results section in form of figures showing graph of Rx versus distance from radar testing unit.

The sample of absorbing materials were attached directly onto the radar unit while a 1.7 mm thick polypropylene plate was designed to simulate the effect of a bumper/fascia on the radar signal. For the detection target, a copper plate was placed at approximately 3.5 m from the radar unit. This target distance shows up as peak in the radar unit output of Rx versus distance.

For each example, the radar signal plots are made with the absorbing material affixed to the radar module and then compared to baseline measurements made without the absorbing material. The absorbing material layer was selectively affixed to the radar unit PCB so as to cover all the area except the transmitting and receiving antenna elements

Radar Absorption/Reflection Test

The radar absorption test is made with the sample directly attached to a rectangular horn antenna and then covered with a metal plate. The spectrum was analyzed using vector network analyzer commercially available from Rohde & Schwarz as model ZVA 67 with frequency up-conversion up to 71-86 GHz using Millitech Spartan Module and 60-90 GHz rectangular horn antenna (Millitech Inc. SGH-12-RP000 A18292).

With the assumption that that metal plate does not transmit, we assume $1S_{21}1=0$ so that Absorption reduces to Absorption=$1-1S_{11}1^2-1S_{21}1^2=1-1S_{11}1^2$ Where $S_{11}$: Reflection coefficient, $S_{21}$: Transmission coefficient This test allows us to characterize absorption characteristics of samples in the 79 GHz band useful for this application.

Example Description

As mentioned previously, the EM absorber material for these examples are combinations of dielectric lossy ceramic CuO+conductive carbon black (CB) in silicone polymer matrix.

| Designation | Description |
| --- | --- |
| CuO Filler | Copper Oxide (>98%), available from American Chemet, IL |
| Ketjenblack Carbon Black-EC 600JD | Carbon Black, available from Azko Nobel Polymer Chemicals LLC, Chicago, USA |
| DMS Z 21 | Succinic Anhydride terminated polydimethylsiloxane, available from Gelest Inc., PA. |
| Sylgard 184 | Two-part silicone elastomer kit, available from Dow Corning, Midland, MI. |

Materials

Example 1

Example 1 is a silicone composite with CuO (80 wt. %) and Carbon Black (1 wt. %) as filler. In a plastic cup, the required amount of Sylgard 184 Part A was degassed under vacuum for 10-15 minutes. The required amount of Sylgard 184 Part B, the curing agent, was then added to the degassed Part A. To this mixture was added a mix of 80 wt. % CuO (from American Chemet) and 1.0 wt % of carbon black (Ketjenblack Carbon Black—EC 600JD). A silane functionalization agent DMS Z21 (1.75 wt. %) was added as a dispersant to the mixture of CuO and carbon black. The plastic cup was covered with a cap configured to allow speed mixing under vacuum (100 mbar) for 2 minutes and 15 seconds. The mixture was then poured onto a stainless steel plate. A second stainless steel plate was placed on top of the mixture and appropriate spacers were used between the two plates to separate them to a desired thickness. The plates containing the mixture were hot pressed at a temperature of 118° C. under a pressure of 3 tons for 45-60 minutes. The plates were allowed to cool for 30-45 minutes before the cured composite sheet was removed.

This polymer composite sheet (with 80 wt. % CuO and 1 wt. % CB) resulted in 1 mm thick sheet useful for testing.

Example 2

Example 2 is also a silicone composite, but with CuO (78 wt. %) and Carbon black (0.4 wt. %). In a plastic cup, the required amount of Sylgard 184 Part A was degassed under vacuum for 10-15 minutes. The required amount of Sylgard 184 Part B, the curing agent, was then added to the degassed Part A. To this mixture was added a mix of 78 wt. % CuO (from American Chemet) and 0.4 wt % of carbon black (Ketjenblack Carbon Black—EC 600JD). A silane functionalization agent DMS Z21 (1.75 wt. %) was added as a dispersant to the mixture of CuO and carbon black. The plastic cup was covered with a cap configured to allow speed mixing under vacuum (100 mbar) for 2 minutes and 15 seconds. The mixture was then poured onto a stainless steel plate. A second stainless steel plate was placed on top of the mixture and appropriate spacers were used between the two plates to separate them to a desired thickness. The plates containing the mixture were hot pressed at a temperature of 118° C. under a pressure of 3 tons for 45-60 minutes. The plates were allowed to cool for 30-45 minutes before the cured composite sheet was removed.

This polymer composite sheet (with 78 wt. % CuO and 0.4 wt. % CB) resulted in 1 mm thick sheet useful for testing.

Test Results—Radar Signal Plots

Figure 8:
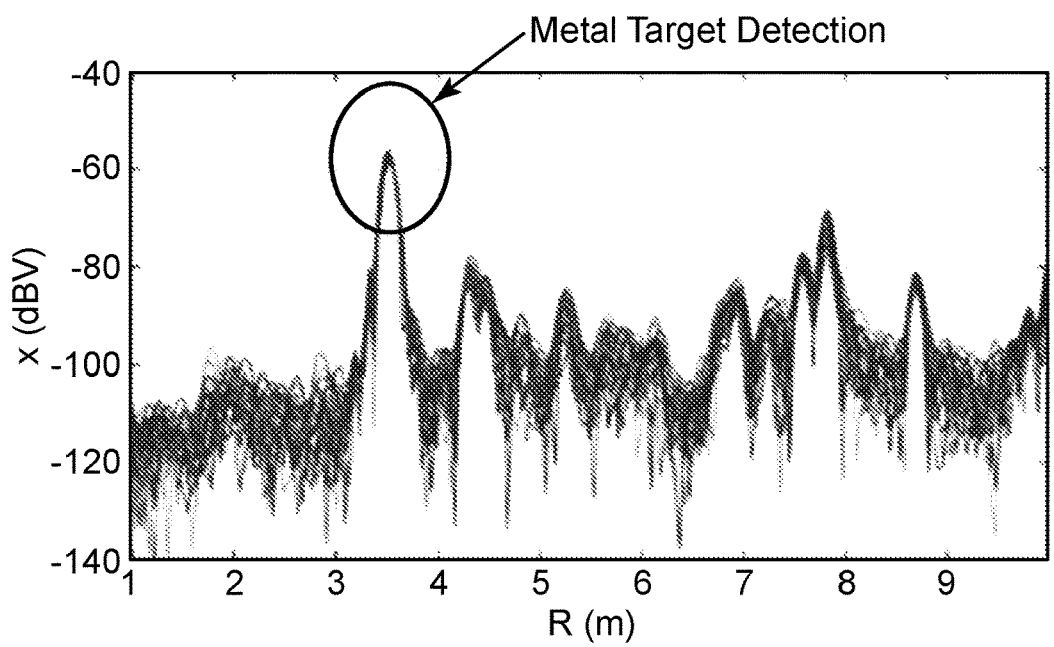
FIG. 8 is a radar signal plot including a metal target and without an absorber composite or a vehicle fascia.
Figure 9:
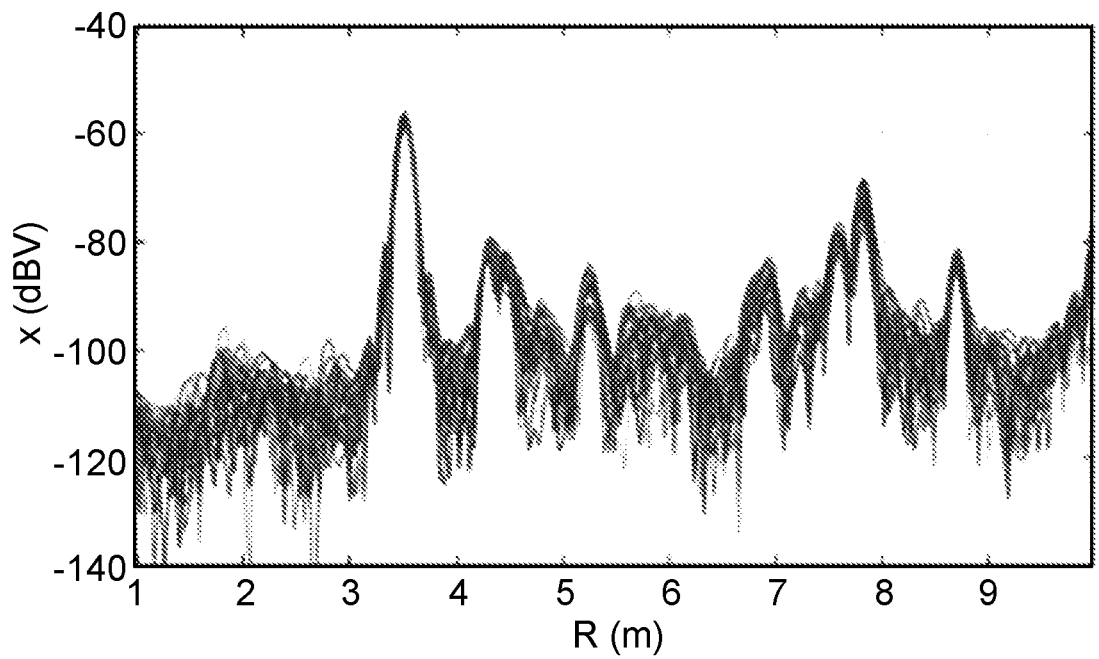
FIG. 9 is a radar signal plot including a metal target and with the absorber composite of Example 1 but without a vehicle fascia.

The radar signal plots for Example 1 show the metal target was detected at 3.5 m by the radar module with the received signal strength of −64 dBV. FIGS. 8 and 9 compare the radar signal plots without any bumper/fascia material inserted at 20 mm distance. The radar module partially covered by EM absorber (FIG. 8) shows almost the same performance as the uncovered case (FIG. 9).

Figure 10:
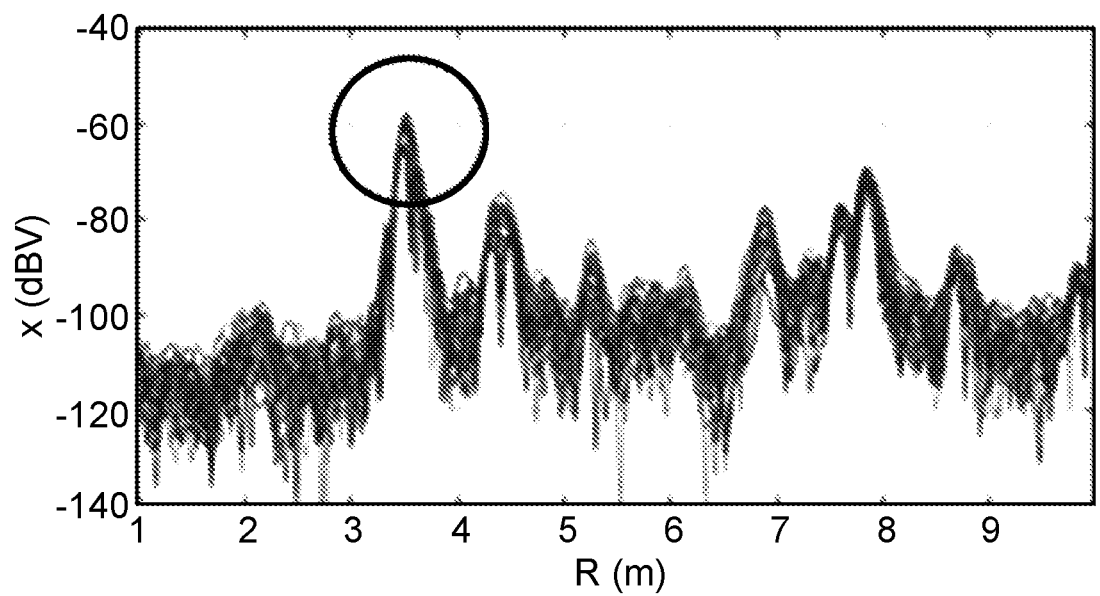
FIG. 10 is a radar signal plot including a metal target and without an absorber composite but with a vehicle fascia.
Figure 11:
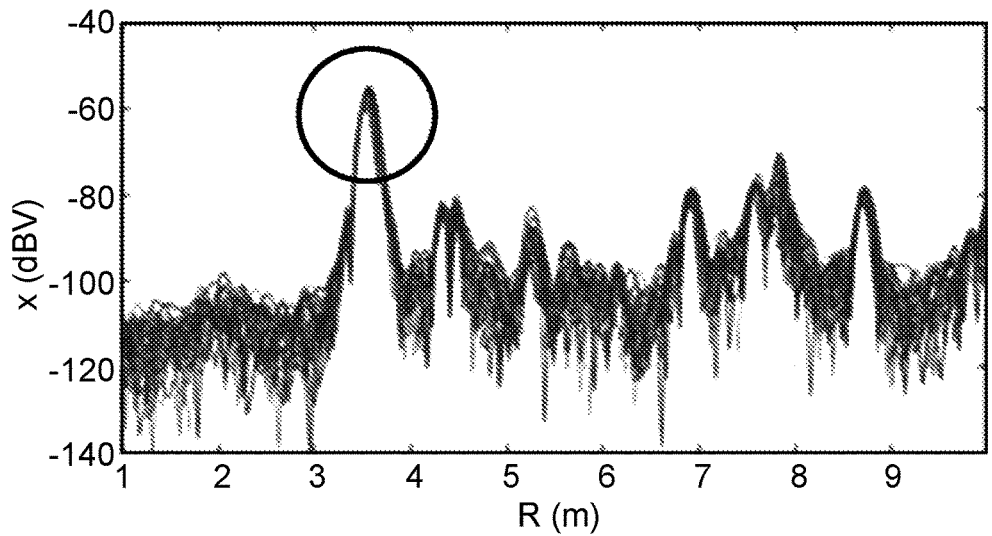
FIG. 11 is a radar signal plot including a metal target and with the absorber composite of Example 1 and a vehicle fascia.

Next, a bumper fascia was placed in front of the radar module for radar performance comparison with and without EM absorber material. FIG. 10 and FIG. 11 compare the radar signal plots with the bumper/fascia material inserted at 20 mm distance. Due to the reflection between the radar module and the bumper fascia, the received signal from the target is diminished with increased noise. As a result, the Signal to Noise (SNR) ratio for the radar signal drops as evident in FIG. 10. In addition to the SNR differences, the residual or ghost images from the bumper/fascia material were observed to be much more evident in the case of no radar absorbing material.

After affixing EM absorber of Example 1 to portions of the radar module PCB, the received signal appears clearer because of reduced reflection between the bumper fascia and the radar module. In this case, the residual or ghost images are greatly reduced.

Test Results—Radar Reflection/Absorption Plots

Figure 12:
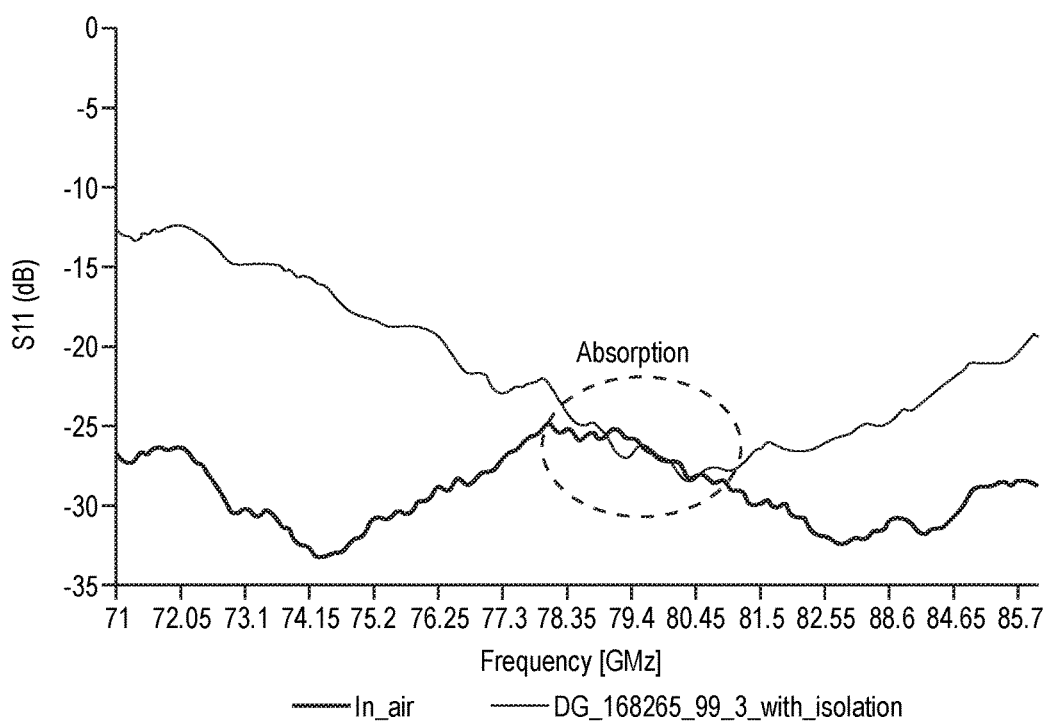
FIG. 12 is a radar reflection plot for Example 1.
Figure 13:
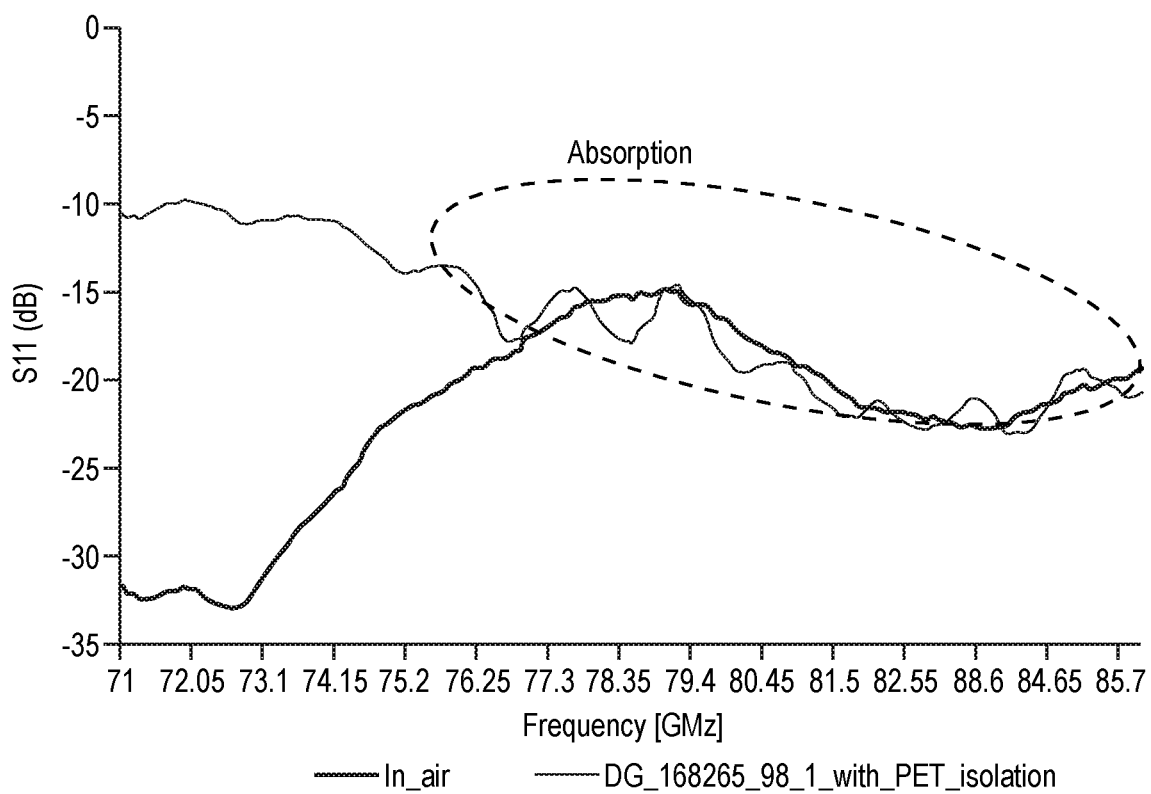
FIG. 13 is a radar reflection plot for Example 2.

FIGS. 12 and 13 show radar reflection plots for Examples 1 and 2, respectively. In these figures there are regions in frequency space where the reflection measured with the absorber film and the air-only result is roughly equivalent. In these ranges, this result implies the absorber is absorbing most of the radiated energy without reflection. By comparing Example 1 and Example 2, we may observe that slight changes in composition of the absorber formulation, absorption bandwidth can be affected significantly.

Descriptions for elements in figures should be understood to apply equally to corresponding elements in other figures, unless indicated otherwise. The present invention should not be considered limited to the particular examples and embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:

1. A radar standing wave dampening system, comprising: a mount including a printed circuit board; a radio wave generating unit disposed on the mount; a radio wave sensing unit disposed on the mount; a non-target interface at a fixed distance from the radio wave generating unit, wherein the non-target interface has a relative permittivity for the frequency range of the radio waves greater than 1; and a gradient permittivity tape comprising an array of at least one of cones and pyramids disposed on the non-target interface; wherein the printed circuit board is a multilayer stack, and at least one layer includes an absorber composite including at least one of ceramic filler, magnetic filler, or conductive filler materials.

2. The radar standing wave dampening system of claim 1, wherein the at least one of ceramic filler, conductive filler, or magnetic filler materials are disposed within a polymeric matrix.

3. The radar standing wave dampening system of claim 2, wherein the polymeric matrix forms a film and is adhered to the printed circuit board.

4. The radar standing wave dampening system of claim 1, wherein the absorber composite includes ceramic filler materials and the ceramic filler materials include at least one of cupric oxide or titanium(II) oxide.

5. The radar standing wave dampening system of claim 1, wherein the absorber composite includes conductive filler materials and the conductive filler materials include at least one of carbon black, carbon bubbles, carbon foam, graphene, carbon fiber, graphite, carbon nanotubes, metal particles, metal nanoparticles, metal alloy particles, metal nanowires, polyacrylonitrile fibers, or conductive-coated particles.

6. The radar standing wave dampening system of claim 1, wherein the absorber composite includes magnetic filler materials and the magnetic filler materials include at least one of Sendust, carbonyl iron, permalloy, ferrites, or garnets.

7. The radar standing wave dampening system of claim 1, wherein the absorber composite is coated on one side of the printed circuit board.

8. The radar standing wave dampening system of claim 1, wherein the absorber composite is coated on both sides of the printed circuit board.

9. The radar standing wave dampening system of claim 1, wherein the gradient permittivity tape includes at least one of plastic bubbles, glass bubbles, ceramic bubbles, gas bubbles, or air bubbles.

10. The radar standing wave dampening system of claim 1, wherein the gradient permittivity tape includes a nonwoven.

11. The radar standing wave dampening system of claim 1, wherein the non-target interface is a vehicle fascia.

12. The radar standing wave dampening system of claim 1, wherein the non-target interface is a radome.

13. The radar standing wave dampening system of claim 1, further comprising a second non-target interface a second fixed distance from the radio wave generating unit.

14. The radar standing wave dampening system of claim 13, comprising a gradient permittivity tape disposed on each of the non-target interface and the second non-target interface.

15. The radar standing wave dampening system of claim 14, wherein the gradient permittivity tape includes at least one of plastic bubbles, glass bubbles, ceramic bubbles, gas bubbles, or air bubbles.

16. The radar standing wave dampening system of claim 14, wherein the gradient permittivity tape includes a nonwoven.

\* \* \* \* \*